(12) United States Patent
Chen et al.

(10) Patent No.: US 7,300,837 B2
(45) Date of Patent: Nov. 27, 2007

(54) FINFET TRANSISTOR DEVICE ON SOI AND METHOD OF FABRICATION

(75) Inventors: Hau-Yu Chen, Kaohsiung (TW); Chang-Yun Chang, Taipei (TW); Cheng-Chung Huang, Jhonghe (TW); Fu-Liang Yang, Hsin-Chu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 132 days.

(21) Appl. No.: 10/836,295

(22) Filed: Apr. 30, 2004

(65) Prior Publication Data
US 2005/0242395 A1    Nov. 3, 2005

(51) Int. Cl.
*H01L 21/8238* (2006.01)
(52) U.S. Cl. ............... 438/213; 438/269; 438/300; 438/607
(58) Field of Classification Search ........... 438/213, 438/300
See application file for complete search history.

(56) References Cited

U.S. PATENT DOCUMENTS 6,872,647 B1 * 3/2005 Yu et al. ............... 438/585
6,936,875 B2 * 8/2005 Sugii et al. ............. 257/288
2005/0035415 A1 * 2/2005 Yeo et al. ............... 257/401

OTHER PUBLICATIONS

Chang et al, "Extremely Scaled Silicon Nano-CMOS Devices." Proceedings of the IEEE, vol. 91, No. 11, 2003, pp. 1860-1873.*
Kedzierski et al, "High-performance symmetric-gate and CMOS-compatible Vt asymmetric-gate FinFET devices," IEEE, 2001, pp. 19.5.1-19.5.4.*

* cited by examiner

*Primary Examiner*—Carl Whitehead
*Assistant Examiner*—Colleen E. Rodgers
(74) *Attorney, Agent, or Firm*—Tung & Associates

(57) ABSTRACT

A FinFET transistor on SOI device and method of fabrication is provided. At least two FinFET fins each having an upper poly-silicate glass portion and a lower silicon portion are formed using spacer patterning technology. Each fin is formed on a sacrificial SiN mask layer having a sacrificial support structure. The SiN mask is removed and then a breakthrough etch is applied to remove an underlying pad oxide layer. A PSG layer defining a width of each of the fins on a sidewall of each of the support structures is deposited on each of the support structures. At least two fins each having a narrow fin pitch of about 0.25 μm. are formed. The fins provide a seed layer for at least two selective epitaxially raised source and drain regions, wherein each raised source-drain associated with each fin are interconnected thus forming a source pad and a drain pad.

29 Claims, 6 Drawing Sheets

FINFET TRANSISTOR DEVICE ON SOI AND METHOD OF FABRICATION

FIELD OF THE INVENTION

The present invention generally relates to FinFET technology and more particularly, relates to a FinFET transistor device on SOI and associated fabrication methods.

BACKGROUND

Performance enhancement between generations of integrated circuit devices is generally achieved by reducing the size of the device, resulting in an enhancement in device speed. This is generally referred to as device "scaling". As scaling increases, to achieve faster device speeds using transistor IC technology, shorter gate lengths, thinner gate oxides and faster response times are necessary.

Metal-oxide-Semiconductor-Field-Effect-transistors, MOSFETs, having a source, a drain region, and a gate electrode formed using a gate oxide, are commonly used in IC devices. As the gate oxide becomes thinner, the device must be powered with a lower voltage power supply to avoid breakdowns and leakage.

Additionally, as CMOS on bulk silicon devices are scaled to channel lengths below 100 nm, conventional CMOS devices suffer from several problems. For example, conventional planar complementary metal oxide semiconductor (CMOS) technology on bulk silicon having a short gate length or node, such as 90 nm or 65 nm, suffers from a degraded performance, including increased leakage currents that occur through channels, junctions, and gate dielectrics. In particular, interactions between the source and drain of the CMOS device typically results in both Vt roll-off and sub-threshold swing, degrading the ability of the gate of the device to control whether the device is on or off. This phenomenon is typically referred to as the "short-channel effect".

To overcome the degraded performance of CMOS on bulk silicon, FinFET transistors on silicon-on-insulator (SOI) structures may be used. Several embodiments of FinFET transistors on SOI structure are disclosed in detail in Hu, (U.S. Pat. No. 6,413,802 B1, issued on Jul. 2, 2002 which is herein incorporated by referenced.

In the generation of layouts for electronic devices, FET can typically be defined by a silicon active area that-intersects with one or more polysilicon lines. The silicon active area is often a two-dimensional, planar layer of silicon. Recent advances allow the planar layer to be replaced by a three-dimensional layer of silicon to create what is commonly referred to as a FinFET.

Silicon-on-insulator (SOI) MOSFETs are formed with an insulator (usually, but not limited to, silicon dioxide) below the device active region, unlike conventional "bulk" MOSFETs, which are formed directly on silicon substrates, and hence, have silicon below the active region. The use of SOI MOSFETs increases device speed over that of CMOS on bulk through smaller subthreshold voltage swings (i.e. better switching off performance). Additionally, SOI MOSFETS are advantageous since the SOI MOSFET reduces unwanted coupling between the source and the drain of the MOSFET through the region below the channel as well as each other. As device size is scaled, however, this becomes increasingly difficult, since the distance between the source and drain is reduced, and hence, both the source and the drain increasingly interact with the channel, thus reducing gate control and increasing short channel effects (SCE).

As shown in prior art FIGS. 1-2a-d, 3-5, a conventional FinFET on SOI structure 10 has a double-gate (DG) MOSFET device that has a thin channel or "fin" region disposed on a SOI. The fin 12 is a silicon shape built on a silicon 14 or Silicon On Insulator (SOI) substrate 16, and extends vertically out of the plane of the substrate to build FET structures. The vertical sides of the fin can be utilized to form FETs. These FETs incorporated into fin structures are called FinFETs.

Among many DG MOS SOI structures, the FinFET structure on SOI has at least one thin vertical fin 12 and self-aligned double gates 18 "wrapped around" or over both sides of the at least one thin vertical fin 12. The DG MOSFET SOI structure 10 provides gate control of the fin from both sides of the fin, thereby reducing SCE. The "wraparound gate" 18 places a gate so that it completely or almost-completely surrounds the fin 12 or channel and thus, provides better gate control and enhances drive currents.

Preferably, the thin fin 12 is made of a silicon material and has the gate overlying the edges of the fin. Alternatively, a wider channel transistor 19 may be formed by providing multiple fins 21 in parallel to share a common gate 23, as shown in FIG. 5.

Both the DG CMOS on SOI device of prior art FIGS. 1, 2a-d, and 3-5 have demonstrated superior performance over planar CMOS on bulk silicon devices by providing both suppression of short-channel effects and reducing leakage currents.

The conventional DG MOSFET on SOI structure is fabricated in a similar manner to that of a planar CMOS on bulk silicon device. Prior art FIG. 1 is an illustration of a FinFET transistor on SOI having one silicon fin. The fin 12 has a thickness of about 15 nm can be formed using existing technology such as e-beam lithography. However, the throughput of E-beam lithography is low and the uniformity is not satisfactory for a sub-30 nm gate length device. Uniformity is critical for a FinFET device because a variation in a fin thickness can cause a change in the channel potential and subband structure, which governs short-channel behavior and quantum confinement effects.

In general, the width, or thickness of each silicon fin ranges between 15 to 40 nm. Additionally, the height of the fin ranges between 45 to 100 nm. The height-to-width ratio or "aspect ratio" of the fin, approximately three-to-one, is higher than that of a planar CMOS fabrication process.

The FinFET on SOI structure shown in prior art FIGS. 1, 2a-d and 3-5 has superior features over planar CMOS on bulk including excellent gate control and elimination of electrostatic coupling and leakage of current between the source and the drain.

The gate wrapping over two side-walls of the vertical un-doped fin of the FinFET on SOI structure provides excellent gate control for turn-off performance, and for turn-on performance by providing the well-known "thin-body" effects, e.g. enhanced mobility and volume immersion. In general, all of the thin fins have the same thickness, and wider transistors may be formed by providing parallel multi-fins that share a common gate (see FIG. 5).

Electrostatic coupling and leakage of both the source and the drain through the bulk silicon is eliminated by using a buried oxide (BOX) layer 16 disposed beneath the device active area.

As shown in FIGS. 2a-d, the fabrication of FinFET on SOI is similar to that of conventional planar CMOS fabricated on bulk silicon as is well known by a person of ordinary skill in the art.

Prior art FIGS. 2a-d illustrate the conventional process of fabricating a FinFET on SOI structure.

FIG. 2a shows Fin patterning and Vt implanting. The silicon layer (un-doped) is formed first by fine lithography (e.g. e-beam) 24 and then is further formed by silicon etching and followed by a Vt implant. As shown in FIG. 2a, the step of Vt implant after silicon etching is optional depending on which gate conduction materials are used.

Unlike bulk substrate fabrication, formation of a shallow trench isolation (STI) trench is not necessary because isolation is provided by the buried oxide layer of SOI.

As shown in FIG. 2b, after the fin patterning process is performed, the surface of the fin is oxidized to form a gate oxide (GOX). Next, after gate oxidation, a gate conductor film, preferably selected from at least one of poly-Si, Mo, and TiN, is deposited over the silicon fin and is patterned as the gate conductor 18. Preferably, the gate is patterned by using an etching process to form perfectly aligned gates straddling over the two sidewalls of the patterned fin. The resulting channel width is calculated to be about 2 times the fin-height associated with each fin, wherein the fin-height is the thickness of the silicon layer of the FinFET on SOI structure.

The threshold voltage, Vt, of the device may be controlled by adjusting the work function of the gate conduction material using a refractory metal, a compound such as titanium nitride, or an alloy such as silicon-germanium alloy. The Vt is determined as is well-known in the art by using a work function of the gate conduction material and a density value of carriers at an on-state.

FIG. 2c illustrates a selective implantation of a lightly doped drain ("LDD") region using a large tilt angle implant 28 into the selective surface of the substrate, thus providing uniformity. The arrows in different angles in FIG. 2c schematically represent the "large angle tilting" during implanting. The photo resist 20 pattern is formed by a typical masking step. The selective LDD implant is therefore performed for n-channel and p-channel regions respectively.

As shown in FIG. 2d, a spacer 30 is formed on the sidewall of the gate 18 and the fin or channel 12 by deposition and etch-back technique. The spacer material is typically silicon dioxide or silicon nitride.

After the spacer is formed, the silicon portion of the fin is exposed (i.e. the portion not underneath the gate and the spacer) to form the source and the drain by heavy n+ or P+ implant using masking steps (not shown in FIG. 2d).

FIG. 3 shows a top view of a FinFET device shown in FIG. 2d having a mask 34 formed thereon (gate 18 not shown). The resistance of the source and drain can be reduced by forming a mask or passivation layer 34 on the source and the drain regions. The passivation layer 34 is formed by depositing a conductive material on the source region, and the drain region. The conductive material may be a metallic silicide such as titanium silicide, cobalt silicide, or nickel silicide, a metallic nitride such as titanium nitride and tantalum nitride, a metal such as tungsten ad copper, or a heavily doped semiconductor such as n+ doped Si.

If the conductive material is cobalt silicide, it may be formed by a self-aligned suicide (salicide) process. In the source and drain regions, the conductive material may be formed on both the top of the fin as well as the sidewall of the fin.

Finally, as shown in FIG. 4, contacts 36 are formed on the conductive material mask between the source, and drain regions using techniques well-known in the art (gate 18 not shown).

SOI technology further improves the speed at which transistors perform and reduces the voltages required to power the transistor. The SOI layer not only reduces the capacitance of the semiconductor switch so it operates faster, but also eliminates the "body effect" which causes lower current and lower performance in CMOS on bulk technology. Due to the SOI characteristics, the FinFET on SOI can operate at lower power than CMOS on bulk technology.

However, narrow fin widths can cause high channel resistance in DG FinFET on SOI devices. It is important to have a very low contact resistance in nanoscale devices.

Therefore, it an object of the present invention to reduce the high channel resistance in DG FinFET on SOI devices having narrow fin widths.

It is a further object of the present invention to eliminate the need for a top mask or passivation layer on top of the source and drain regions of a FinFET transistor device.

SUMMARY OF THE INVENTION

The present invention provides a FinFET transistor device having at least two gates and an epitaxially raised source/drain contact pad.

In a preferred embodiment of the present invention, the device of the present invention provides a FinFET transistor device having:
  a silicon on oxide substrate having
    a bottom silicon layer,
    a buried oxide layer disposed upon the bottom silicon layer;
  at least two fins formed upon the buried oxide layer, wherein each of the at least two fins have an associated top wall, and two associated side walls;
  at least two epitaxially formed source regions formed upon each of the at least two fins, wherein the at least two source regions are interconnected to form a source pad;
  at least two epitaxially formed drain regions formed upon each of the at least two fins, wherein the at least two drain regions are interconnected to form a drain pad.

In another preferred embodiment the present invention provides a FinFET transistor device having:
  a silicon on oxide (SOI) substrate having
    a bottom silicon layer,
    a buried oxide layer disposed upon the bottom silicon layer;
  a plurality of spaced apart fins formed upon the buried oxide layer, wherein the plurality of spaced apart fins each have an associated top wall, and two associated side walls;
  a plurality of epitaxially formed source regions, wherein each of the plurality of epitaxially formed source regions are formed upon each of the plurality of spaced apart fins, and wherein each of the plurality of source regions are interconnected to form a source contact pad; and
  a plurality of epitaxially formed drain regions, wherein each of the plurality of epitaxially formed drain regions are formed upon each of the plurality of spaced apart fins, and wherein each of the plurality of drain regions are interconnected to form a drain contact pad.

In another preferred embodiment, a FinFET on silicon on insulator (SOI) transistor device can be formed by:
  forming at least two uniform fins each having
    an upper PSG layer, and
    a lower Si layer;

growing at least two selective epitaxially raised source regions, wherein the at least two source regions are interconnected to form a source pad; and growing at least two selective epitaxially raised drain regions, wherein the at least two drain regions are interconnected to form a drain pad.

In another embodiment of the present invention, at least two fins having a narrow thickness of about 6.5 nm and a pitch of 0.25 μm defining two channels is provided that allows the device to perform with the advantages of "thin body" effects. The raised source pad and drain pad reduce contact resistance.

The raised source and drain pads operate to reduce channel resistance. Additionally, the raised source and drain pads eliminate the need for a top mask or passivation layer to be deposited on top of the source and drain regions of the FinFET transistor device of the present invention.

BRIEF DESCRIPTION OF THE DRAWINGS

These and other objects, features and advantages of the present invention will become apparent from the following detailed description and the appended drawings in which:

FIG. 9b is a plan view of the SOI substrate structure of FIG. 9a.

FIG. 10b is a cross sectional view taken along section line A-A of FIG. 10a.

FIG. 12b illustrates a cross sectional view taken along section line B-B of FIG. 12a.

FIG. 14c is an enlarged perspective view of the PSG spacer fins shown in FIG. 14a.

DETAILED DESCRIPTION OF THE PREFERRED EMBODIMENTS

Generally, the present invention provides a novel FinFET transistor on SOI device and method of fabrication. The present invention defines at least two FinFET transistor fins each having an upper poly-silicate glass portion and a lower silicon portion using a spacer patterning technology. Each fin is formed by patterning a sacrificial SiN mask with a sacrificial support structure, wherein a CVD pad oxide is first deposited underneath the SiN mask on a top silicon layer of a SOI substrate. The SiN hard mask is removed and then a breakthrough etch is applied to remove the pad oxide below the SiN layer. The final fin formation step provides forming an oxide hard mask and using an etch to define at least two, and preferably, multiple fins having a close fin pitch, preferably about 0.25 μm. Each fin is called a "spacer".

After the fins or spacers are formed, selective epitaxy is used to form a raised source-drain, wherein each raised source-drain associated with each fin will be connected to each other due to the narrow fin pitch, thereby forming a source and drain (S/D) pad. The S/D pad layer operates to reduce channel resistance resulting from narrow fins and eliminates the need for an additional conductive mask layer to be applied over the source and the drain.

Figure 1:
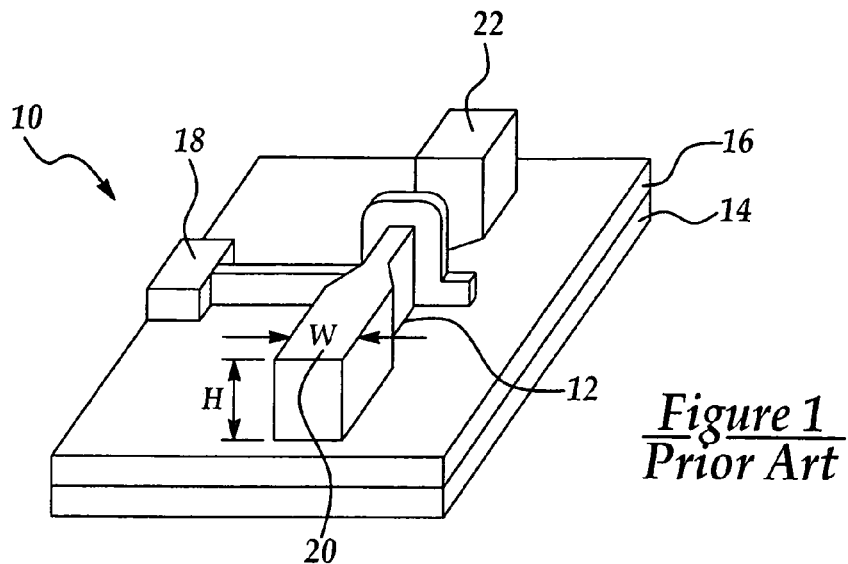
FIG. 1 is an illustration of a prior art FinFET transistor on SOI having one silicon fin.
Figure 2A:
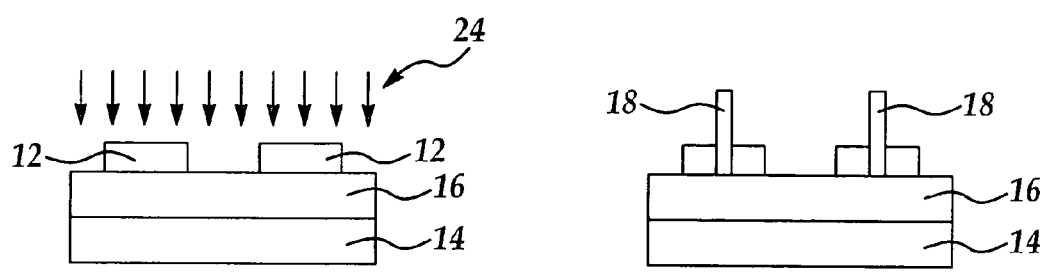
FIG. 2a is an illustration of a prior art Fin patterning and a Vt implanting process.
Figure 2B:
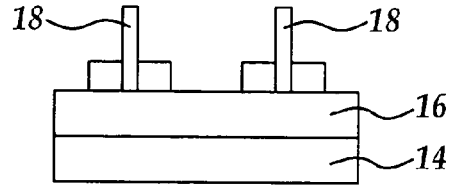
FIG. 2b is an illustration of a prior art gate oxidation process.
Figure 2C:
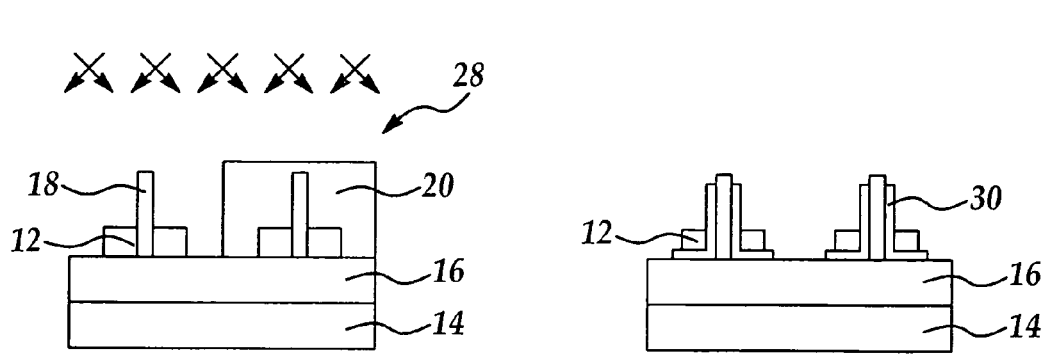
FIG. 2c is an illustration of a prior art tilt angle implantation of a lightly doped drain process.
Figure 2D:
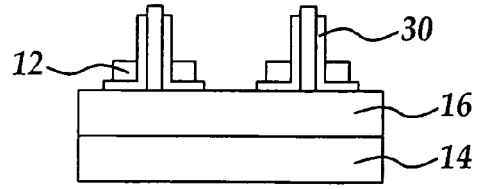
FIG. 2d is an illustration of a prior art spacer formation process.
Figure 3:
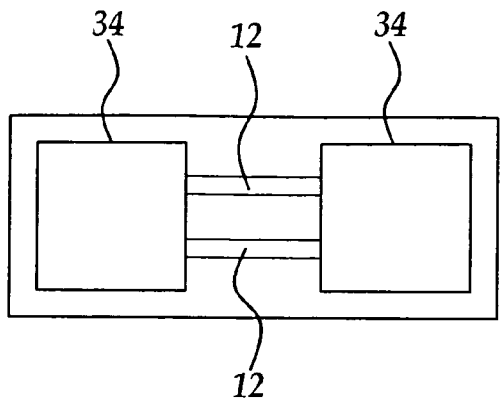
FIG. 3 is a top view of FIG. 2d further having deposition of a prior art conduction layer process using a mask.
Figure 4:
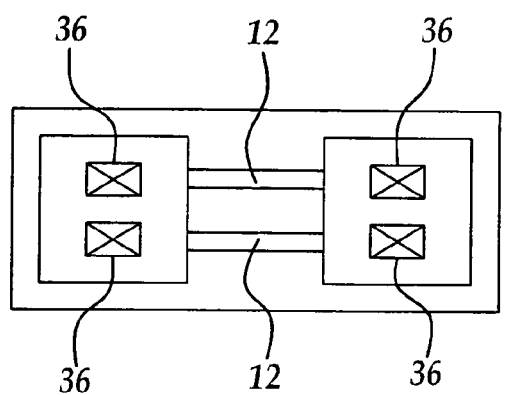
FIG. 4 is a top view of prior art FIG. 3 further having contacts formed on the conduction layer.
Figure 5:
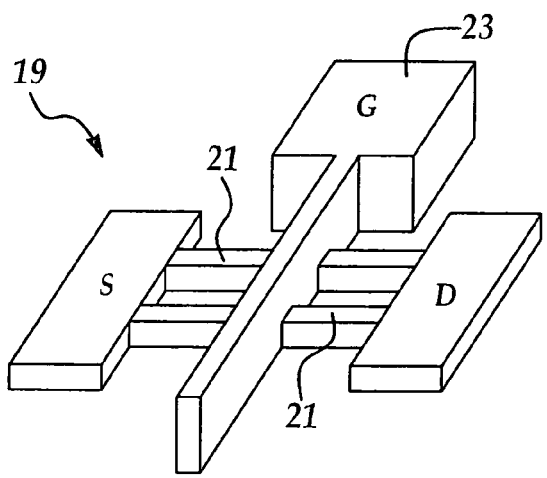
FIG. 5 is a perspective view of a prior art FinFET transistor on SOI having two silicon fins sharing a common gate.
Figure 6:
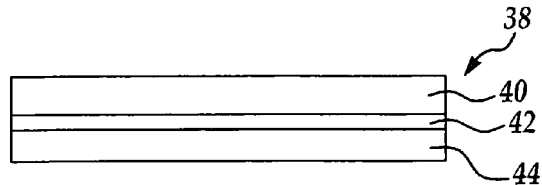
FIG. 6 is a cross-sectional view of a semiconductor silicon-on-insulator substrate structure

Referring now to the drawings, as shown in a cross-sectional view of a semiconductor substrate structure in FIG. 6, a SOI substrate structure 38, preferably having a <100> orientation is provided as a starting material. The substrate 38 has a top silicon layer 40, a middle insulator layer or buried oxide (BOX) layer 42, preferably formed from a silicon oxide material, and a bottom silicon layer 44.

Figure 7:
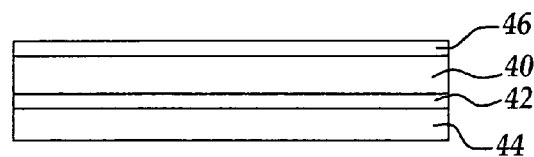
FIG. 7 is a cross sectional view of the SOI substrate structure of FIG. 6 having a CVD oxide deposited and etched to form a hard pad oxide mask on the SOI substrate.

As shown in a cross sectional view of the SOI substrate structure in FIG. 7, the top silicon layer 40 has a CVD oxide that is deposited and etched to form a hard pad oxide mask 46. The hard pad oxide mask 46 operates to protect the top silicon layer 40 during a subsequent etch.

Figure 8:
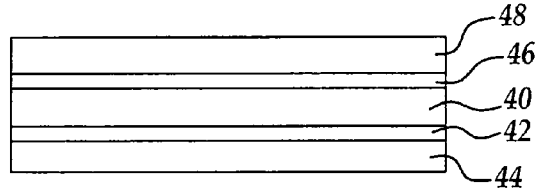
FIG. 8 is a cross sectional view of the SOI substrate structure of FIG. 6 having a silicon nitride mask deposited on the hard pad oxide layer of the SOI substrate.

A sacrificial etchant mask material commonly used for masking an etch process, such as photoresist, silicon dioxide (SiO$_2$), or silicon nitride is deposited on the hard pad oxide mask 46. As shown in FIG. 8, the etchant mask 48 is preferably silicon nitride because silicon nitride is harder than Silicon dioxide and thus provides better scratch protection, is a better moisture and sodium barrier (without doping), has a higher dielectric strength, and resists oxidation. The ability to resist oxidation makes silicon nitride useful in local oxidation of silicon (LOCOS) for isolation purposes.

Figure 9A:
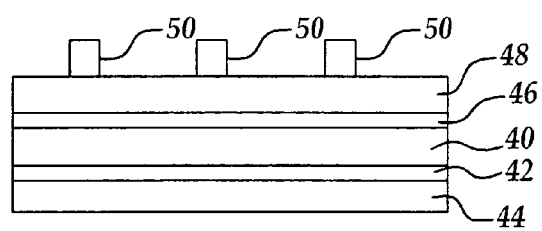
FIG. 9a is a cross sectional view of the SOI substrate structure of FIG. 8 having sacrificial fin support structures.

In one embodiment shown as a cross sectional view of the SOI substrate structure in FIG. 9a, the sacrificial SiN mask is patterned into sacrificial spacer or fin support structures 50, preferably formed from a photoresist material to support spacer fins using a spacer patterning technology process such as optical lithography. Preferably at least one sacrificial support structure 50 may be provided. However, as shown in FIG. 9A, an alternative embodiment provides a plurality of spacer support structures 50.

Alternatively, a low pressure chemical vapor deposition (LPCVD) process may be used to pattern the SiN mask. The result of (LPCVD) process results in a film having the composition of Si$_3$N$_4$.

Figure 9B:
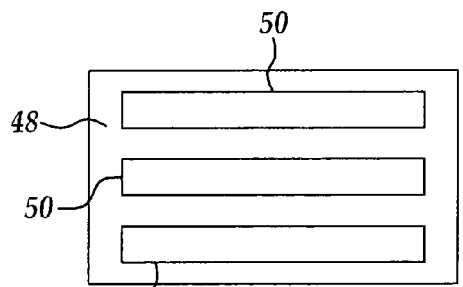

FIG. 9b shows a plan view of the SOI substrate structure having the patterned sacrificial spacer support structures 50.

A vertical profile is critical when using spacer patterning technology because a sloped sacrificial spacer support sidewall 52 would lead to sloped spacers or "fins", thus resulting in increased final line widths. Thus, removal of polymers adhering to the side walls of the sacrificial spacer support structures 50, having an estimated residual polymer thickness of about 20 to 30 nm, after performing the SiN etch is necessary to prevent enlargement of feature size. A postetch treatment for removal of polymers may be performed.

Figure 10A:
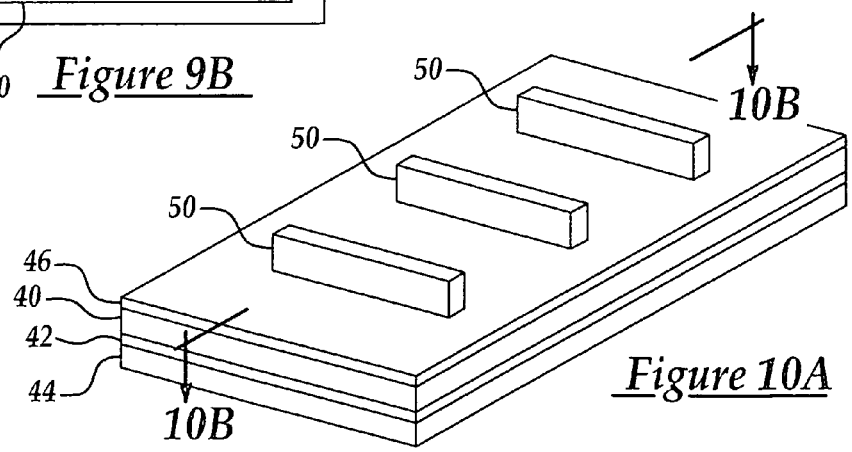
FIG. 10a is a perspective view of the SOI substrate structure having the sacrificial support structures formed on the hard pad oxide layer.

FIG. 10a shows a perspective view of the SOI substrate structure having the sacrificial support structures 50 formed on the hard pad oxide layer 46.

Figure 10B:
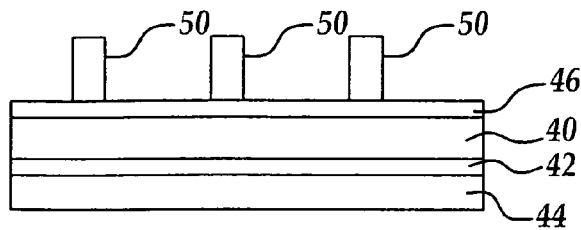

FIG. 10b shows a cross sectional view taken along section line 10B-10B of FIG. 10a. As shown in FIG. 10b, The SiN hard mask is removed by a process such as anisotropic plasma etching. Thus, the sacrificial support structures 50 remain after removal of the sacrificial SiN hard mask 48.

Figure 10C:
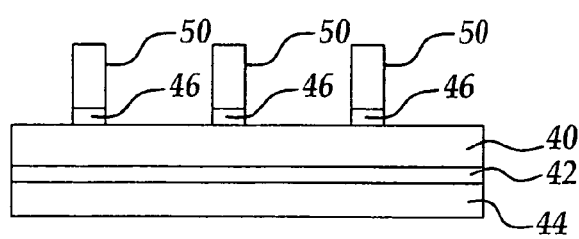
FIG. 10c is a cross sectional view of the SOI substrate structure having a hard pad oxide layer removed by etching.

FIG. 10c shows a cross sectional view of the SOI substrate structure having a breakthrough etch applied to remove the hard pad oxide layer. A portion of the pad oxide 46 remains under the sacrificial support structures 50.

The SOI substrate top silicon layer 40 is then patterned as a sacrificial silicon layer for defining the device active area.

Figure 11:
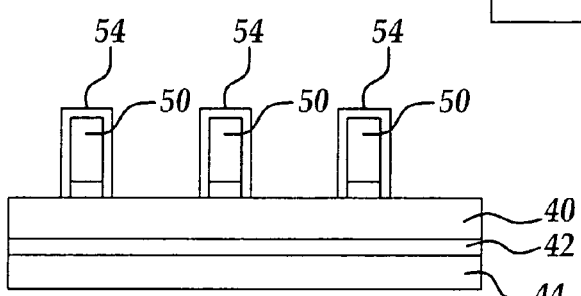
FIG. 11 is a cross sectional view of the SOI substrate structure having a patterned top silicon layer of the SOI substrate.

A cross sectional view of the SOI substrate structure after the top silicon layer 40 is patterned is shown in FIG. 11. A Phospho-silicate glass (PSG), perfarably having a thickness range between about 10 nm and 30 nm, is then deposited using LPCVD over the patterned Si layer. Desirably, a low PSG deposition rate of about 8 nm/min is used to ensure uniformity of the PSG film. The thickness of PSG layer 54 at the sidewalls of the sacrificial support structures 50 determines the final W$_{fin}$. The W$_{fin}$ is the FinFET transistor device channel or body thickness.

A fin fabricated using the spacer patterning technology disclosed herein has a width smaller and more uniform than a fin that may be fabricated using a conventional lithographic process.

Figure 12A:
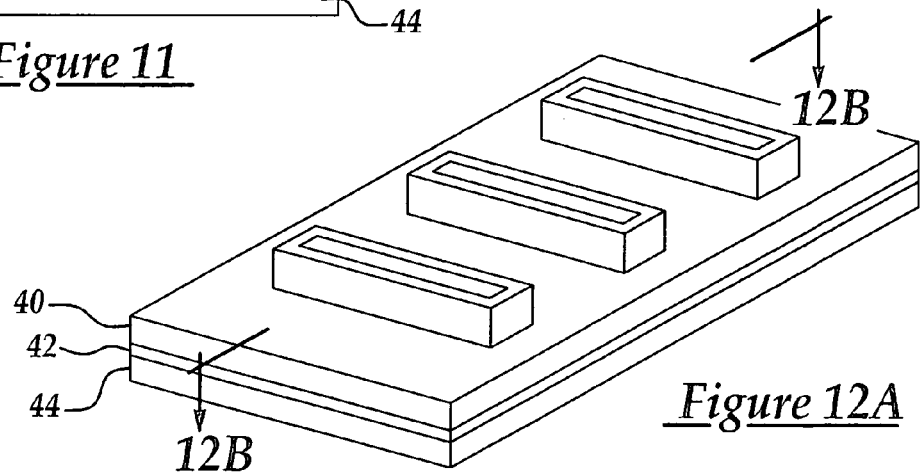
FIG. 12a is a perspective view of the SOI substrate structure having a removed top film of a PSG layer deposited on the sacrificial top silicon layer.
Figure 12B:
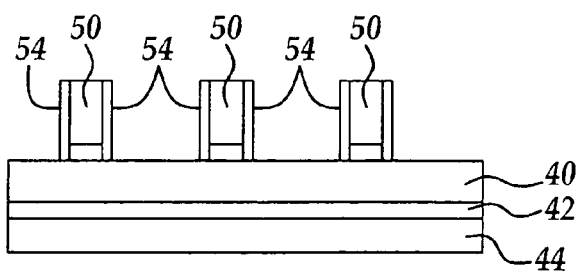

FIG. 12a shows a perspective view of the SOI substrate structure having a removed top film of the PSG deposited on the sacrificial top silicon layer 40. FIG. 12b illustrates a cross sectional view taken along section line 12B-12B of FIG. 12a.

As shown in FIGS. 12a-12b, a subsequent anisotropic PSG spacer etch is used to remove the PSG film on top of each of the sacrificial fin support structures 50 and to generate an even number of spacers of "fins".

Preferably a 100% PSG over etch is applied to eliminate any spacer tails at the bottom of each sacrificial fin support structure 50 which would otherwise result in a broadened fin width. A 70% step coverage of the PSG film may yield fin widths ranging between about 6.5 nm and 20 nm. In a preferred embodiment, silicon fins 56 as narrow as 6.5 nm are preferable, each silicon fin has two vertical side walls 58 as shown in FIG. 13.

Figure 13:
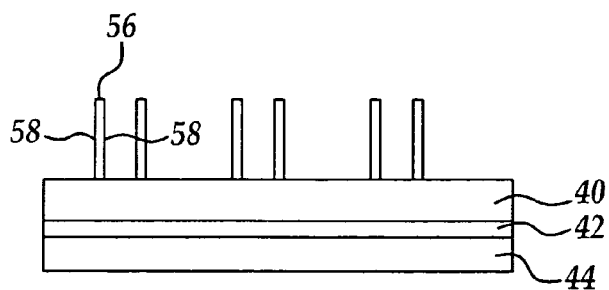
FIG. 13 a cross sectional view of the SOI substrate structure having PSG formed spacer fins.

FIG. 13 shows a cross sectional view of the SOI substrate structure having PSG spacer fins 56. As shown in FIG. 13, the sacrificial fin support structures 50 are removed after the anisotropic PSG spacer etch and 100% PSG over etch is applied, preferably by using a dry anisotropic etch process. The final PSG fin profile is shown in FIG. 13.

Figure 14A:
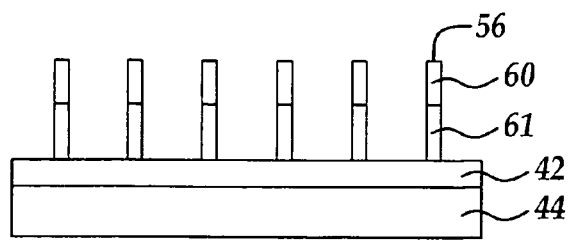
FIG. 14a is a cross-sectional side-view of the SOI substrate structure having a removed sacrificial patterned top silicon layer of the SOI substrate.

FIG. 14a shows a cross-sectional side-view of the SOI substrate structure having a removed sacrificial patterned top silicon layer 40. At least two fins are formed for each sacrificial support structure provided 50, thus if only one sacrificial support structure is provided, then at least two associated fins 56 will be formed. However, in a preferred embodiment shown in FIGS. 14a-14b, if a plurality of sacrificial support structures are used, the number of fins is doubled for every sacrificial support structure formed.

Figure 14B:
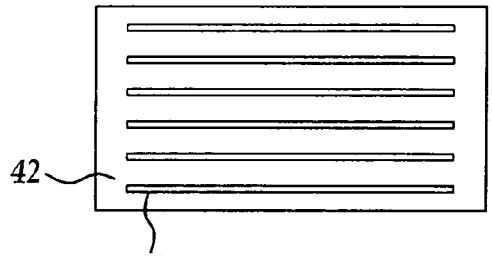
FIG. 14b is a top view of the SOI substrate structure having a top patterned silicon on oxide layer etched to form a lower silicon portion of each of the plurality of fins.

FIG. 14b shows a top view of the SOI substrate structure shown in FIG. 14a. FIG. 14a, the top patterned silicon on oxide layer 40 is etched to form a lower silicon portion of each of the plurality of fins 56. Thus, each fin has a top PSG portion 60 and a lower silicon portion 61. Each fin defines a transistor channel for the FinFET on SOI device of the present invention. Additionally, each fin provides a seed layer for epitaxial growth of a raised source region and a raised drain region.

Figure 14C:
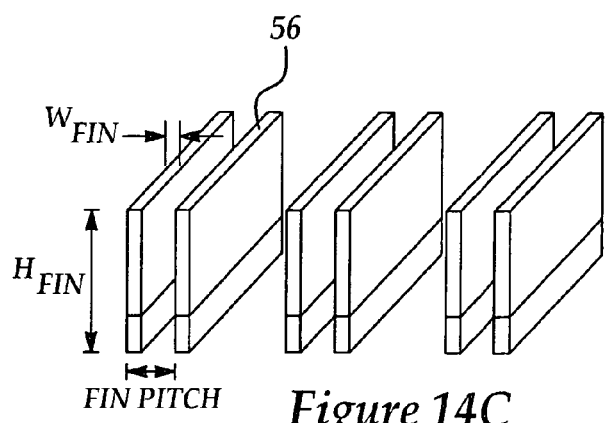

FIG. 14c shows an enlarged perspective view of the PSG spacer fins shown in FIG. 14a. As shown in FIG. 14c, preferably, a plurality of fins 56 having a narrow fin pitch, of about 0.25 μm are formed, wherein each of the plurality of fins has a narrow fin width W$_{fin}$ close and a fin-height H$_{fin}$. The narrowing of fin pitch can double the device density, which then doubles the drive current for a given lithography pitch. Thus, the multiple fin spacer defining method disclosed herein increases drive current.

An optional fin surface smoothening step may be used to improve or reduce the surface roughness of each of the plurality of fins' vertical sidewalls 58. The removal of etchant damage to each silicon fin prior to gate dielectric formation allows the device to have at least a double-gate structure since a gate electrode will be formed on each of the plurality of fins vertical sidewalls 58 and on a top surface 60 of each of the plurality of fins 56.

In a preferred embodiment (not shown), the fin surface smoothening is performed by subjecting the fin to a sacrificial oxidation step. Without the sacrificial oxidation step, the fin may have a bowed profile due to a faster oxidation rate at the middle of each of the plurality of fins.

In a preferred embodiment, the vertical sidewalls 58 of each of the plurality of fins 56 may be treated, preferably using a high temperature anneal at 1000° C. in H$_2$ ambient. The shape of each of the plurality of fins may be square-like or rounded at the top.

In another preferred embodiment, the sacrificial oxide is then removed preferably using an oxide remover well known in the art such as a hydrofluoric acid (HF) etchant.

During HF removal of the sacrificial oxide, the buried oxide beneath each of the fins 42 may be undercut. Thin oxides in patterned holes may be etched away with a water and HF solution.

An active pattern is defined by the plurality of uniform spacer fins 56. The uniform spacer fins allow for superior control over short-channel behavior and quantum confinement effects in comparison to fins formed using a prior art process disclosed herein.

The spacer technique forms only one line width, and thus, variable fin widths can be achieved by using a photoresist to define the entire active region. The active pattern is then transferred to the underlying buried oxide layer 42.

Figure 15:
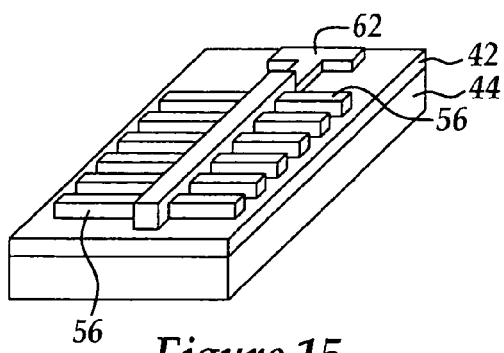
FIG. 15 is a perspective view of the SOI substrate device structure having a gate oxide grown over a plurality of fins and over the BOX layer.

FIG. 15 shows a perspective view of the SOI substrate device structure having a gate oxide 62 grown over the plurality of fins 56 and over the BOX layer 42. As shown in FIG. 15, a gate oxide 62 is grown and then preferably, an in-situ anneal is used to improve the gate-oxide quality.

Figure 16:
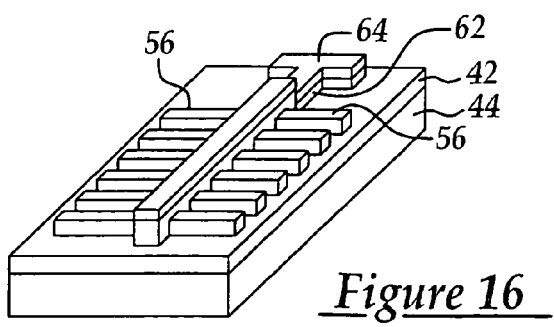
FIG. 16 is a perspective view of the SOI substrate device structure having a gate material deposited over the gate oxide.

FIG. 16 shows a perspective view of the SOI substrate device structure having a gate electrode material 64 deposited over the gate oxide 62. The gate electrode material 64 is deposited over the fins 56 and BOX layer 42 to produce an appropriate threshold voltage using a gate work-function engineering process well known in the art. The gate electrode material 64 may be polycrystalline-silicon (poly-Si), poly-crystalline silicon-germanium (poly-SiGe), a refractory metal such as molybdenum and tungsten, compounds such as titanium nitride, or other conducting materials. In a preferred embodiment, the gate electrode material 64 may be pre-doped.

The gate electrode material 64 is patterned by using conventional lithography and an etching process to form at least two perfectly aligned gates straddling over each of the plurality of the fins 56. The gate etching process stops on the gate oxide 62, wherein the gate 64 is electrically isolated from the device structure by the gate oxide 62. The gate 64 has a top surface and two sidewalls 66.

The gate length is about two times the fin width. Thus, a thin body or fin allows for more aggressive gate-length scaling. In the FinFET transistor device of the present invention, the threshold voltage is mainly determined by the gate work function, so that statistical dopant fluctuation effects are reduced and impurity scattering is minimized.

Figure 17:
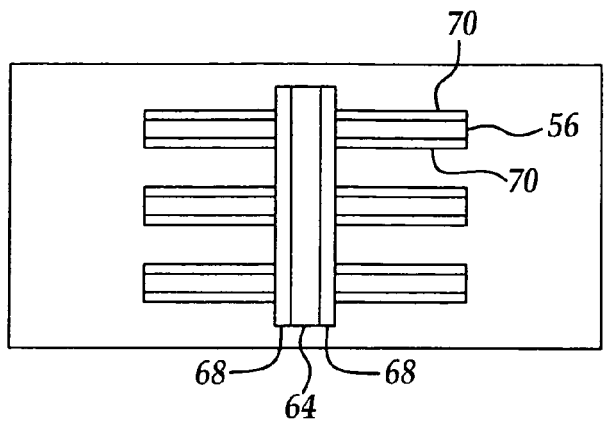
FIG. 17 is a plan view of a spacer formed on each sidewall of a gate structure and a spacer formed on each of a plurality of vertical sidewalls associated with each of a plurality of fins.

As shown in FIG. 17, a spacer 68 is formed on each sidewall of the gate 64 and a spacer 70 is formed on each of the vertical sidewalls 58 associated with each of the plurality of fins 56 by deposition and selective etching using an etch-back process of a spacer material. The spacers 70 are also shown in FIG. 19.

The spacer material may be selected from a dielectric material such as silicon nitride or silicon dioxide. In a preferred embodiment, the spacer is made of a silicon nitride and oxide composite material.

Figure 18:
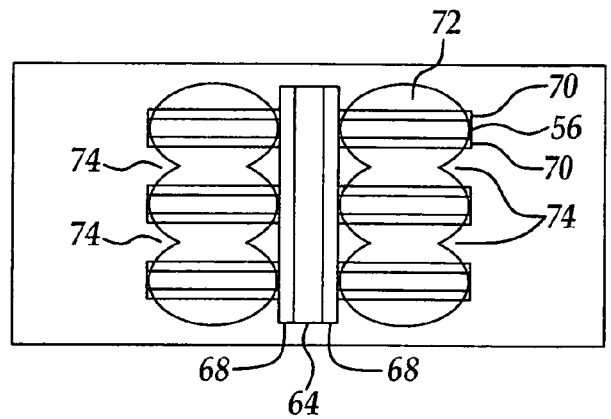
FIG. 18 is a plan view of a FinFET transistor on SOI device of the present invention having epitaxially raised and interconnected source and drain regions.
Figure 19:
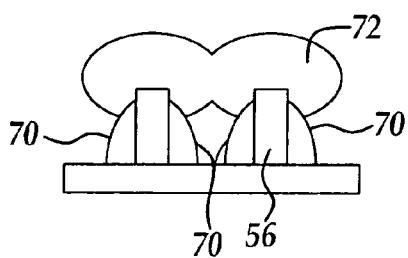
FIG. 19 is an elevational view of the device shown in FIG. 18.

As shown in FIGS. 18-19 selective silicon epitaxy may be used to form raised source and drain regions on the fins 56. Epitaxial silicon refers to a single crystalline structure of silicon film, wherein silicon atoms are deposited on an exposed silicon surface in a CVD reactor. An epitaxial film deposited 72 on a <100>-oriented wafer will take on a <100>-orientation. Each fin PSG portion 60 provides a seed layer for epitaxial silicon growth.

If the fin surface has a thin amorphous layer such as PSG, the resulting film structure is polysilicon.

In a preferred embodiment, silicon tetrachloride ($SiCl_4$) is a favored choice for depositing silicon. It has a high formation temperature or growth rate and has a reversible chemical reaction. The reaction creates silicon atoms in one direction and removes silicon in the other direction.

Initially, the PSG surface of the fin is etched preparing it for the deposition reaction. In the second stage, the deposition of silicon is faster than the etch, with the net result of a deposited film.

With an increasing percentage of $SiCl_4$ molecules in the gas stream, the deposition rate first increases. At a 0.1 Cl to silicon ratio, the etching reaction starts to dominate and slows down the growth rate. Preferably Hydrogen Chloride (HCl) is metered into the chamber where it etches away a thin layer of the silicon surface, preparing it for the silicon deposition.

FIG. 18 illustrates a plan view of the FinFET transistor on SOI device of the present invention having a selective epitaxially raised and interconnected source and drain regions.

FIG. 19 illustrates an elevational view of the device shown in FIG. 18. Preferably, as shown in FIG. 19, the epitaxially formed layer 72 on each of the plurality of fins 56 is not too thick, being preferably about 200 A thick. The epitaxially formed layer operates to form a bridge 74 over the source and drain regions. If the time for selective epitaxial growth is too fast, inconsistent poly or multiple bridges will be formed. Therefore, the growth rate of the selective epitaxial layer should be closely monitored to avoid inconsistent poly bridge formation.

Because the fin pitch of the plurality of fins 56 is close, the epitaxially raised source region and raised drain region associated with each fin will be connected to each other to form a source pad 78 and drain pad 80. The large area of the pads operates to reduce channel resistance typically resulting from fins having a narrow fin width.

The present invention also eliminates the need for an additional mask to be formed to deposit a deposition metal on the FinFET transistor on SOI device.

Figure 20:
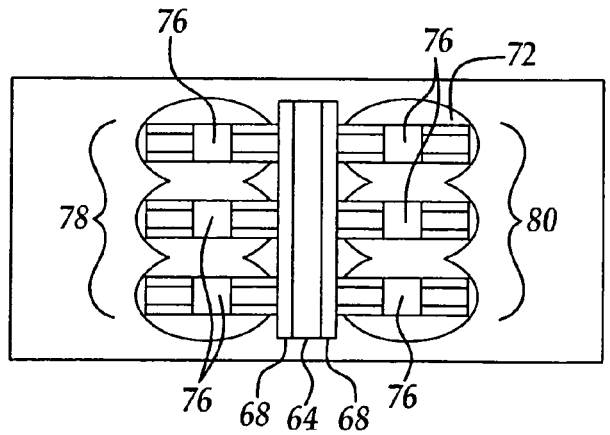
FIG. 20 is a plan view of a FinFET transistor device of the present invention having contacts formed on a selective epitaxial layer.

FIG. 20 shows a top view of the FinFET transistor device of the present invention having contacts 76 formed on epi layer. The contacts are formed by the interconnection of the source 78 and the drain 80 regions of the FinFET device. Alternatively, contacts may be formed on the source and the drain regions using a conventional contact forming method well-known in the art.

From the foregoing, it should be appreciated that several embodiments of a FinFET transistor device and associated fabrication methods have been provided.

While a preferred exemplary embodiment has been presented in the foregoing detailed description, it should be understood that a vast number of variations exist and this preferred exemplary embodiment is merely an example, and it is not intended to limit the scope, applicability or configuration of the invention in any way. Rather, the foregoing detailed description provides those of ordinary skill in the art with a convenient guide for implementing a preferred embodiment of the invention and various changes can be made in the function and arrangements of the exemplary embodiment without departing from the spirit and scope of the appended claims.

What is claimed is:

1. A FinFET transistor device comprising:
   a semiconductor on insulator substrate comprising:
   a bottom layer of silicon or silicon germanium,
   a buried oxide layer disposed upon the bottom silicon layer;

at least two fins formed spaced apart upon the buried oxide layer, wherein each of the at least two fins have an associated top wall, and two associated side walls;

an epitaxial layer formed over and upon each of the at least two fins to form at least two source regions, wherein the at least two source regions are interconnected by said epitaxial layer bridging between said at least two fins and said at least two source regions to form a source pad; and, an epitaxial layer formed over and upon each of the at least two fins to form at least two drain regions, wherein the at least two drain regions are interconnected by said epitaxial layer bridging between said at least two fins to form a drain pad.

2. The device of claim 1 wherein the epitaxial layer has a thickness of between 200 angstroms and 500 angstroms.

3. The device of claim 1 wherein the at least two fins are uniformly formed by a spacer patterning technology process.

4. The device of claim 3 wherein the at least two fins further comprise:
a fin pitch of between 0.08 µm and 0.24 µm.

5. The device of claim 3 wherein at least two fins further comprise:
a fin width of between 10 nm and 100 nm.

6. The device of claim 1 wherein each of the at least two fins each comprise:
a lower silicon semiconductor portion; and
an upper PSG portion, wherein the upper PSG portion defines a seed layer for epitaxial growth of said source or drain regions.

7. The device of claim 1 further wherein each of the at least two fins define a transistor channel.

8. The device of claim 1, further comprising:
a gate oxide layer grown on the top wall and the two side walls associated with each of the at least two spaced apart fins and on a top surface of the buried oxide layer of the SOI substrate.

9. The device of claim 8, further comprising:
a gate electrode material selected from at least one of polycrystalline-silicon, poly-crystalline silicon-germanium, molybdenum, tungsten, and nickel silicide, wherein the gate electrode material is deposited over the gate oxide layer.

10. The device of claim 8, further comprising:
a pre-doped polysilicon material deposited over the gate oxide layer to form a gate electrode.

11. The device of claim 1, wherein each source region and each drain region has an associated contact formed thereon.

12. A FinFET transistor device comprising:
a silicon on oxide (SOI) substrate having
a bottom silicon layer,
a buried oxide layer disposed upon the bottom silicon layer;
a plurality of spaced apart fins formed upon the buried oxide layer, wherein the plurality of spaced apart fins each have an associated top wall, and two associated side walls;
a plurality of epitaxially formed source regions comprising an epitaxial layer, said epitaxial layer formed upon each of the plurality of spaced apart fins, and wherein each of the plurality of source regions are interconnected by said epitaxial layer bridging between said plurality of spaced apart fins and said plurality of source regions to form a source contact pad; and
a plurality of epitaxially formed drain regions comprising an epitaxial layer, said epitaxial layer formed upon each of the plurality of spaced apart fins, and wherein each of the plurality of drain regions are interconnected by said epitaxial layer bridging between said plurality of spaced apart fins and said plurality of drain regions to form a drain contact pad.

13. The device of claim 12 wherein said epitaxial layer has a thickness of about 200 angstroms to about 500 Angstroms.

14. The device of claim 12 wherein each fin of the plurality of spaced apart fins are uniformly formed by a spacer patterning technology process.

15. The device of claim 14 wherein the plurality of uniformly formed spaced apart fins further comprise:
a fin pitch between 0.08 µm and 0.24 µm.

16. The device of claim 14 wherein the plurality of uniformly formed spaced apart fins further comprise:
a fin width of between 10 nm and 100 nm.

17. The device of claim 12 wherein each of the plurality of spaced apart fins comprise:
a lower semiconductor portion; and
an upper PSG portion, wherein the upper PSG portion defines a seed layer for epitaxial growth of said source regions or drain regions.

18. The device of claim 12 further wherein each of the plurality of spaced apart fins each define a transistor channel.

19. The device of claim 12, further comprising:
a gate oxide layer grown on the top wall and the two side walls associated with each of the plurality of spaced apart fins and on a top surface of the buried oxide layer of the SOI substrate.

20. The device of claim 19, further comprising:
a gate electrode material deposited over the gate oxide layer.

21. The device of claim 12, wherein each source region and each drain region has an associated contact formed thereon.

22. A FinFET transistor device comprising:
a semiconductor on insulator substrate comprising:
a bottom layer of silicon or silicon germanium,
a buried oxide layer disposed upon the bottom silicon layer;
at least two fins comprising a lower semiconductor portion and an upper PSG portion, said at least two fins formed spaced apart upon the buried oxide layer, wherein each of the at least two fins have an associated top wall, and two associated side walls;
at least two epitaxially formed source regions formed upon an upper portion of each of the at least two fins, wherein the at least two source regions are interconnected to form a source pad; and,
at least two epitaxially formed drain regions formed upon each of the at least two fins, wherein the at least two drain regions are interconnected to form a drain pad.

23. The device of claim 22 wherein the source and drain pads comprise a selectively formed epitaxially film having a thickness of between about 200 angstroms and about 500 angstroms.

24. The device of claim 22 wherein the at least two fins are uniformly formed by a spacer patterning technology process.

25. The device of claim 22 wherein the at least two fins further comprise:
a fin pitch of between 0.08 µm and 0.24 µm.

26. The device of claim 22 wherein at least two fins further comprise:
a fin width of between 10 nm and 100 nm.

27. The device of claim 22, further comprising:
a gate oxide layer grown on the top wall and the two side walls associated with each of at least two spaced apart fins and on a top surface of the buried oxide layer of the SOI substrate.

28. The device of claim 22, further comprising:
a gate electrode material selected from at least one of polycrystalline-silicon, poly-crystalline silicon-germanium, molybdenum, tungsten, and nickel silicide, wherein the gate electrode material is deposited over the gate oxide layer.

29. The device of claim 22, further comprising:
a pre-doped polysilicon material deposited over the gate oxide layer to form a gate electrode.

* * * * *